(12) United States Patent
Senjiyuu

(10) Patent No.: US 8,878,611 B2
(45) Date of Patent: Nov. 4, 2014

(54) HIGH-FREQUENCY AMPLIFIER

(75) Inventor: Tomohiro Senjiyuu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 13/540,972

(22) Filed: Jul. 3, 2012

(65) Prior Publication Data

US 2013/0076441 A1  Mar. 28, 2013

(30) Foreign Application Priority Data

Sep. 22, 2011  (JP) .................................. 2011-207441

(51) Int. Cl.
*H03F 3/16* (2006.01)

(52) U.S. Cl.
USPC .......................................... 330/277; 330/302

(58) Field of Classification Search
USPC .................................. 330/277, 302
See application file for complete search history.

(56) References Cited

U.S. PATENT DOCUMENTS

| | | | |
|---|---|---|---|
| 4,792,987 A * | 12/1988 | Tumeo | 330/277 |
| 5,023,569 A * | 6/1991 | Raven | 330/302 |
| 5,736,901 A | 4/1998 | Nakamura et al. | |
| 5,805,023 A | 9/1998 | Fukuden | |
| 5,880,641 A | 3/1999 | Kim | |
| 5,977,834 A * | 11/1999 | Davis et al. | 330/302 |
| 7,508,269 B2 * | 3/2009 | Fukuda et al. | 330/302 |
| 2004/0124926 A1 | 7/2004 | Kang et al. | |
| 2006/0255880 A1 | 11/2006 | Suzaki et al. | |
| 2008/0204149 A1 | 8/2008 | Suzuki et al. | |
| 2012/0146731 A1 | 6/2012 | Khesbak | |

FOREIGN PATENT DOCUMENTS

| | | |
|---|---|---|
| EP | 0 818 884 A2 | 1/1998 |
| EP | 0 818 884 A3 | 1/1998 |
| EP | 1 134 890 A1 | 9/2001 |
| EP | 1 962 418 A1 | 8/2008 |
| JP | 2006-319569 | 11/2006 |

OTHER PUBLICATIONS

The Extended European Search Report issued Apr. 18, 2013, in Application No. / Patent No. 12175465.9-1810 / 2587666.

* cited by examiner

*Primary Examiner* — Khanh V Nguyen
(74) *Attorney, Agent, or Firm* — Oblon, Spivak, McClelland, Maier & Neustadt, L.L.P.

(57) ABSTRACT

According to one embodiment, a high-frequency amplifier is provided with a field effect transistor for performing amplification, and a stabilizing circuit. The field effect transistor has a source which is configured to be grounded. The stabilizing circuit is connected to a gate of the field effect transistor. The stabilizing circuit has impedance which changes so as to increase as the voltage of a drain of the field effect transistor increases.

2 Claims, 4 Drawing Sheets

HIGH-FREQUENCY AMPLIFIER

CROSS-REFERENCE TO RELATED APPLICATION

The application is based upon and claims the benefit of priority from the prior Japanese Patent Application No. 2011-207441, filed on Sep. 22, 2011, the entire contents of which are incorporated herein by reference.

FIELD

Embodiments described herein relate generally to a high-frequency amplifier.

BACKGROUND

A source-grounded field effect transistor for use in a high-frequency amplifier has a capacitance between a gate for inputting a signal and a drain for outputting a signal. Due to the capacitance, the output signal may be fed back to an input side so that oscillation is generated.

The output impedance of the source-grounded field effect transistor has a characteristic of a large negative resistance when the drain voltage is lower than an operating voltage. When the drain voltage rises gradually from zero V, self-heating of the source-grounded field effect transistor may restrain the negative resistance characteristic so that oscillation may be difficult to occur. However, when the drain voltage rises rapidly, oscillation may occur before the source-grounded field effect transistor generates is heated. In order to restrain oscillation, a stabilizing circuit may be added to a high-frequency amplifier.

FIG. 4 is a circuit diagram illustrating a high-frequency amplifier including a stabilizing circuit of a prior art. As illustrated in FIG. 4, in the high-frequency amplifier according to the prior art, a stabilizing circuit 402 is connected to a gate of a field effect transistor 401. The stabilizing circuit 402 is provided with a resistor and a capacitor serially-connected with each other, and is grounded The value of the resistor is selected so as to suppress destabilization in a low voltage area when a drain voltage of a source-grounded field effect transistor rises from zero V to an operating voltage, e.g., 10V.

FIG. 5 is a graph illustrating a difference in gain between a case where the drain voltage is a low voltage and a case where the drain voltage is an operating voltage, with regard to the prior art. In FIG. 5, the vertical axis indicates a maximum available gain, and the lateral axis indicates a frequency. In FIG. 5, a curve 501 indicates a case where the drain voltage is 2V, and a curve 502 indicates a case where the drain voltage is 10V that is the operating voltage.

FIG. 6 is a graph illustrating a difference in stability factor between a case where the drain voltage is the low voltage and a case where the drain voltage is the operating voltage, with regard to the prior art. In FIG. 6, the vertical axis indicates a stability factor, and the lateral axis indicates a frequency. In FIG. 6, a curve 601 indicates a case where the drain voltage is 10V that is the operating voltage, and a curve 602 indicates a case where the drain voltage is 2V.

As illustrated in FIG. 6, when a resistance value of the stabilizing circuit 402 is selected so that the stability factor exceeds 1 (one) at a drain voltage of 2V that is the low voltage, the maximum available gain decreases in the case where the drain voltage is 10V that is the operating voltage, as compared with the case where the drain voltage is 2V, according to FIG. 5.

According to the prior art, in selecting the resistance value of the stabilizing circuit 402, the gain of the high-frequency amplifier is not considered to be made large for the purpose of assigning priority to stabilization of output of the high-frequency amplifier.

DETAILED DESCRIPTION

Figure 1:
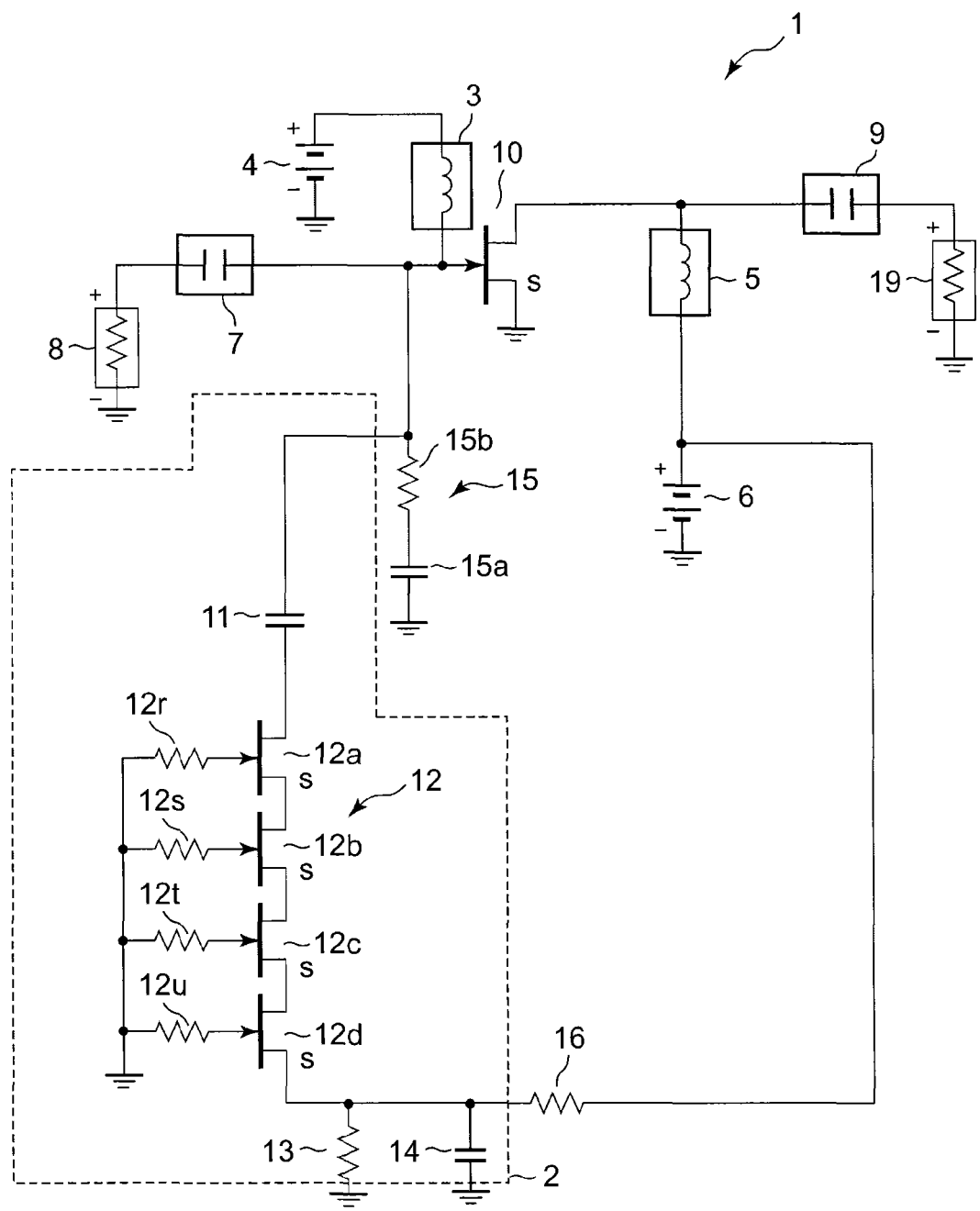
FIG. 1 is a circuit diagram illustrating a configuration of a high-frequency amplifier according to an embodiment.

According to one embodiment, a high-frequency amplifier is provided with a field effect transistor for performing amplification, and a stabilizing circuit. The field effect transistor has a source which is configured to be grounded. The stabilizing circuit is connected to a gate of the field effect transistor. The stabilizing circuit has impedance which changes so as to increase as the voltage of a drain of the field effect transistor increases.

Hereinafter, further embodiments will be described with reference to the drawings.

In the drawings, the same reference numerals denote the same or similar portions respectively.

A further embodiment will be described with reference to FIG. 1.

FIG. 1 is a circuit diagram illustrating a configuration of the embodiment.

As illustrated in FIG. 1, a high-frequency amplifier 1 is provided with an N-channel field effect transistor 10 for performing amplification, and a stabilizing circuit 2. The field effect transistor 10 is, for example, a MESFET of normally-on type. A source of the field effect transistor 10 is grounded. A gate of field effect transistor 10 is grounded through a series circuit of a coil 3 and a direct-current power supply 4. A drain of field effect transistor 10 is grounded through a series circuit of a coil 5 and a direct-current power supply 6. The gate of field effect transistor 10 is further grounded through a direct-current block (capacitor) 7 and a resistor 8. The drain of field effect transistor 10 is grounded through a direct-current block (capacitor) 9 and a resistor 19.

A stabilizing circuit 2 is connected to the gate of source-grounded field effect transistor 10. The stabilizing circuit 2 has an impedance which changes so as to increase as a voltage of the drain of source-grounded field effect transistor 10 increases.

The stabilizing circuit 2 is provided with, for example, a capacitor 11, a series circuit 12 including a plurality of N-channel field effect transistors 12a to 12d which are connected serially with each other, a resistor 13, and a capacitor 14. The field effect transistors 12a to 12d are, for example, MESFETs of normally-on type. One end of the capacitor 11 is connected to the gate of the source-grounded field effect transistor 10. One end of the series circuit 12, that is, a drain of field effect transistor 12a is connected to the other end of the capacitor 11.

A source of the field effect transistor 12a is connected to a drain of the field effect transistor 12b. A source of the field effect transistor 12b is connected to a drain of the field effect transistor 12c. A source of the field effect transistor 12c is connected to a drain of the field effect transistor 12d. Gates of the field effect transistors 12a to 12d are grounded through resistors 12r to 12u, respectively.

The other end of the series circuit 12, that is, a source of the field effect transistor 12d is connected to one end of the resistor 13, one end of the capacitor 14 and one end of the resistor 16. The other end of the resistor 13 and the other end of the capacitor 14 are grounded. The source of the field effect transistor 12d is connected through the resistor 16 to one end of direct-current power supply 6 provided on a side of a coil 5. The field effect transistors 12a to 12d are used for impedance adjustment of stabilizing circuit 2.

Further, the gate of source-grounded field effect transistor 10 is also connected to one end of a series circuit 15 of a capacitor 15a and a resistor 15b connected serially with each other, that is, one end of the resistor 15b. The series circuit 15 is connected in parallel with the stabilizing circuit 2.

The other end of the series circuit 15, that is, one end of the capacitor 15a is grounded. The series circuit 15 may be omitted.

An operation of the high-frequency amplifier 1 will be described below more specifically.

In a case where any voltage is not applied to the gate of the source-grounded field effect transistor 10, a voltage output from the drain of the source-grounded field effect transistor 10 is zero V.

At the time, the potential of the source of the field effect transistor 12d is zero V. Further, since the gates of the field effect transistors 12a to 12d are grounded, the potentials of the gates are zero V. Accordingly, the field effect transistors 12b to 12d as switches are in an ON state, that is, indicate low impedances.

As a result, the stabilizing circuit 2 operates in a similar manner to a case where the stabilizing circuit 2 is grounded.

Thus, the impedance of the stabilizing circuit 2 becomes several Ω, which causes a loss of a high frequency signal for feedback to an input side and restrains oscillation.

Subsequently, as a voltage applied to the gate of the source-grounded field effect transistor 10 increases, the states of the field effect transistors 12a to 12d used for impedance adjustment change from ON to OFF one after another continuously.

When an operating voltage is applied to the gate of the source-grounded field effect transistor 10, a voltage of the drain of the source-grounded field effect transistor 10 becomes a voltage sufficient to pinch off the field effect transistors 12a to 12d.

As a result, stabilizing circuit 2 operates in a similar manner to a case where stabilizing circuit 2 is in an OPEN state.

Accordingly, the an impedance of the stabilizing circuit 2 becomes several thousand Ω, which minimizes the loss of the high frequency signal and restrains decrease of the maximum available gain of the source-grounded field effect transistor 10.

Figure 2:
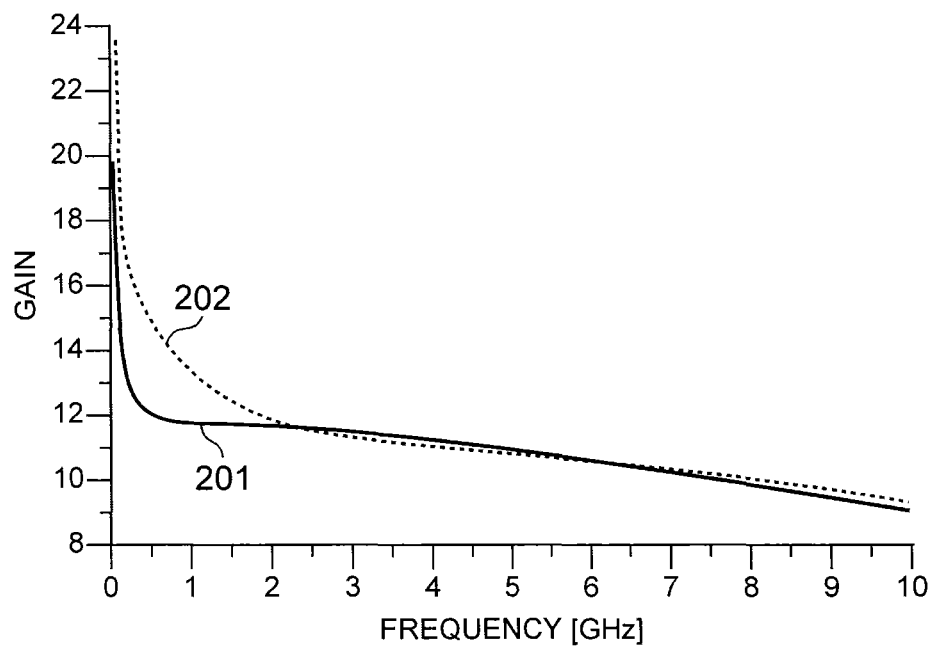
FIG. 2 is a graph illustrating a difference in maximum available gain between a case where a drain voltage is a low voltage and a case where the drain voltage is an operating voltage, with regard to a source-grounded field effect transistor used in the high-frequency amplifier of the embodiment.

FIG. 2 is a graph illustrating a difference in maximum available gain between a case where the drain voltage is a low voltage and a case where the drain voltage is an operating voltage, with regard to of the source-grounded field effect transistor according to the embodiment. In FIG. 2, the vertical axis indicates a maximum available gain, and the lateral axis indicates a frequency. In FIG. 2, a curve 201 indicates a case where the drain voltage is 2V, and a curve 202 indicates a case where the drain voltage is 10V that is the operating voltage.

Figure 3:
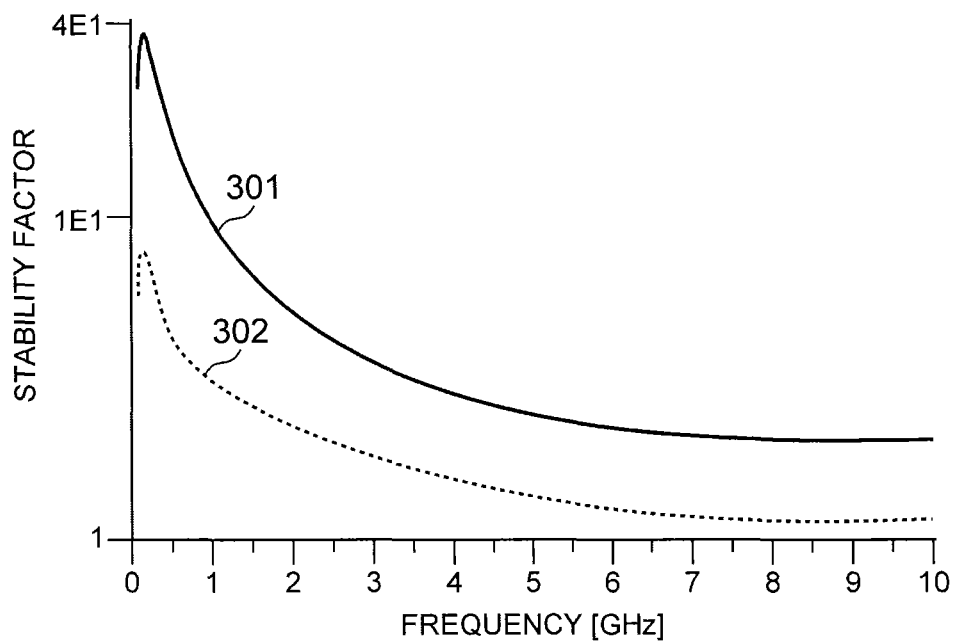
FIG. 3 is a graph illustrating a difference in stability factor between the case where the drain voltage is the low voltage and the case where the drain voltage is the operating voltage, with regard to the source-grounded field effect transistor used in the high-frequency amplifier of the embodiment.
Figure 4:
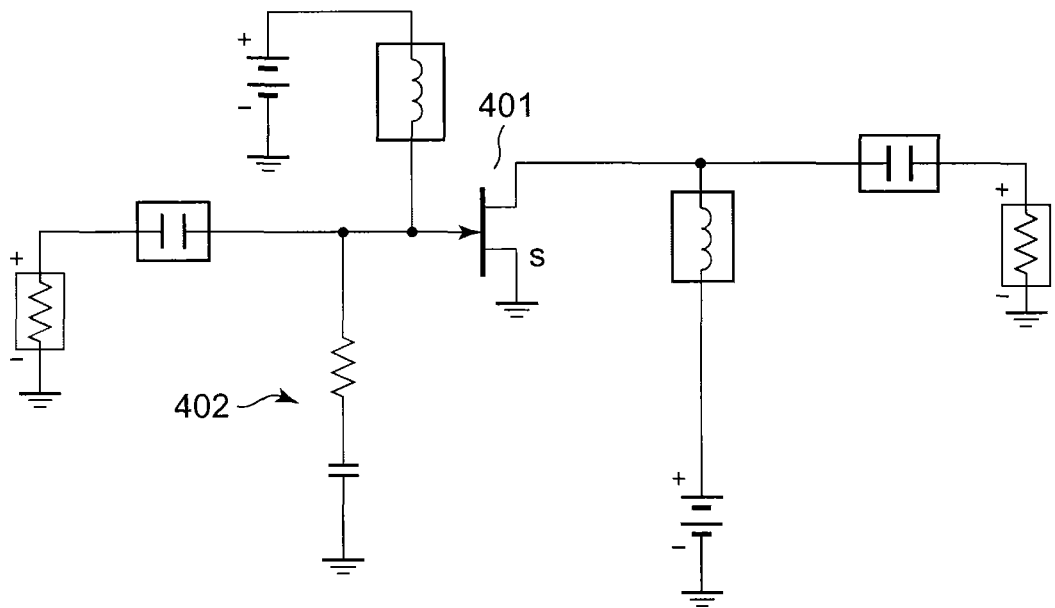
FIG. 4 is a circuit diagram illustrating a high-frequency amplifier including a stabilizing circuit according to a prior art.
Figure 5:
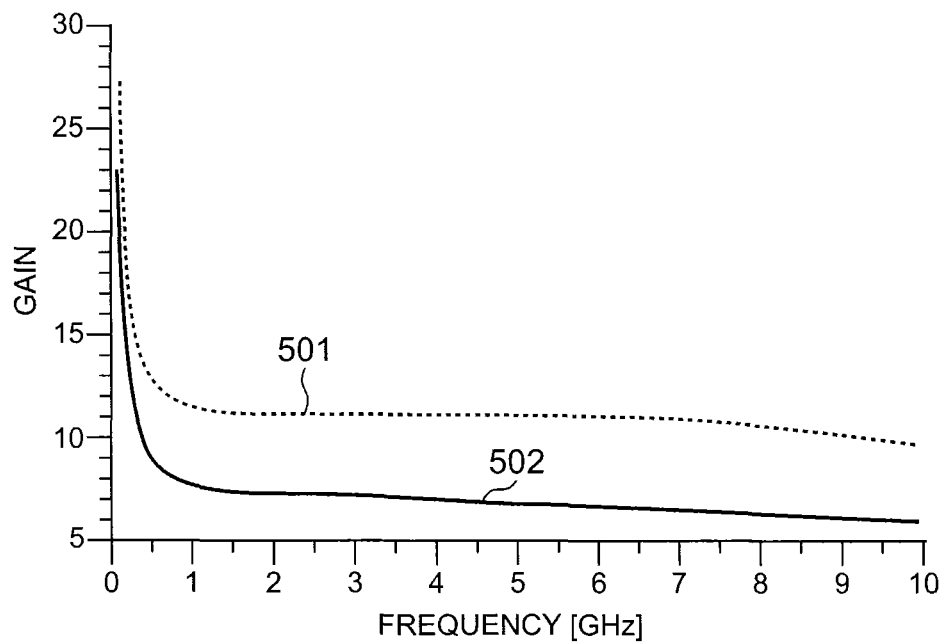
FIG. 5 is a graph illustrating a difference in maximum available gain between a case where a drain voltage is a low voltage and a case where the drain voltage is an operating voltage, with regard to a source-grounded field effect transistor used in the high-frequency amplifier of the prior art.
Figure 6:
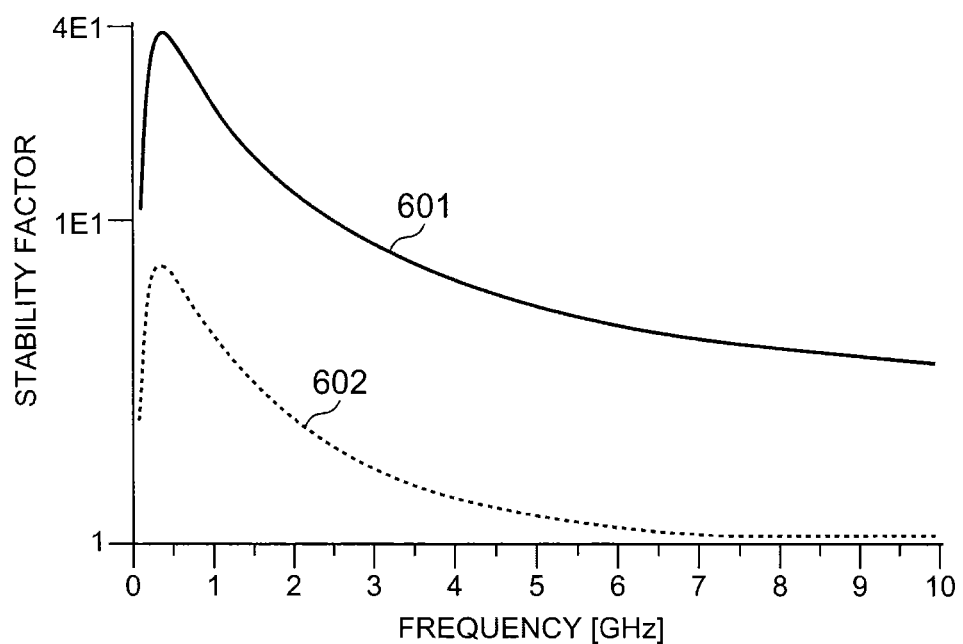
FIG. 6 is a graph illustrating a difference in stability factor between the case where the drain voltage is the low voltage and the case where the drain voltage is the operating voltage, with regard to the source-grounded field effect transistor used in the high-frequency amplifier of the prior art.

FIG. 3 is a graph illustrating a difference in stability factor between the case where the drain voltage is the low voltage and the case where the drain voltage is the operating voltage. In FIG. 3, the vertical axis indicates a stability factor, and the lateral axis indicates a frequency. In FIG. 3, a curve 302 indicates the case where the drain voltage is 2V, and a curve 301 indicates the case where the drain voltage is 10V that is the operating voltage.

Even if the resistance value of resistor 13 is selected so that the stability factor exceeds 1 (one) in the case where the drain voltage is 2V that is a low voltage, as illustrated in FIG. 3, the maximum available gain does not decrease in the case where the drain voltage is 10V as compared with the case where the drain voltage is 2V, as illustrated in FIG. 2, and thus, the maximum available gain itself becomes large.

As described above, in the high-frequency amplifier 1 of the embodiment, the stabilizing circuit 2 is connected to the gate of source-grounded field effect transistor 10 for performing amplification the source of which is grounded. The stabilizing circuit 2 has an impedance which changes so as to increase as a voltage of the drain of the source-grounded field effect transistor 10 increases.

Accordingly, the high-frequency amplifier 1 of the embodiment is capable of taking advantage of the maximum available gain which the source-grounded field effect transistor 10 for performing amplification has fundamentally, while stabilization of the high-frequency amplifier 1 is enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A high-frequency amplifier comprising:
   a first field effect transistor for performing amplification, a source of the first field effect transistor is configured to be grounded; and
   a stabilizing circuit connected to a gate of the first field effect transistor, the stabilizing circuit having an impedance which changes so as to increase as a voltage of a drain of the first field effect transistor increases,
   wherein the stabilizing circuit is provided with first and second capacitors, at least one second field effect transistor, and a resistor, one end of the first capacitor is connected to the gate of the first field effect transistor, a drain of the second field effect transistor is connected to the other end of the first capacitor, a gate of the second field effect transistor is grounded, a source of the second field effect transistor is connected to the drain of the first field effect transistor, one end of the resistor is grounded and the other end of the resistor is connected to the source of the second field effect transistor, one end of the second capacitor is grounded, and the other end of the second capacitor is connected to the source of the second field effect transistor in parallel with the resistor.

2. The high-frequency amplifier according to claim 1, further comprising a series circuit of a second resistor and a third capacitor connected serially with each other, the series circuit being provided in parallel with the stabilizing circuit, wherein one end of the second resistor is connected to the gate of the first field effect transistor, and one end of the third capacitor is grounded.

* * * * *